(12) United States Patent
Takemoto et al.

(10) Patent No.: US 11,324,120 B2
(45) Date of Patent: May 3, 2022

(54) FLEXIBLE PRINTED CIRCUIT BOARD

(71) Applicant: SUMITOMO ELECTRIC PRINTED CIRCUITS, INC., Koka (JP)

(72) Inventors: Tsuyoshi Takemoto, Koka (JP); Hiroshi Ueda, Koka (JP)

(73) Assignee: SUMITOMO ELECTRIC PRINTED CIRCUITS, INC., Koka (JP)

( * ) Notice: Subject to any disclaimer, the term of this patent is extended or adjusted under 35 U.S.C. 154(b) by 45 days.

(21) Appl. No.: 16/488,755

(22) PCT Filed: Feb. 26, 2018

(86) PCT No.: PCT/JP2018/006906
§ 371 (c)(1),
(2) Date: Aug. 26, 2019

(87) PCT Pub. No.: WO2018/163878
PCT Pub. Date: Sep. 13, 2018

(65) Prior Publication Data
US 2021/0068255 A1 Mar. 4, 2021

(30) Foreign Application Priority Data
Mar. 8, 2017 (JP) .............................. JP2017-044415

(51) Int. Cl.
*H05K 1/16* (2006.01)
*H05K 1/02* (2006.01)
(Continued)

(52) U.S. Cl.
CPC ............. *H05K 1/165* (2013.01); *H05K 1/028* (2013.01); *H05K 1/0233* (2013.01);
(Continued)

(58) Field of Classification Search
CPC ................... H05K 1/165; H05K 1/028; H05K 2201/0215; H05K 2201/0209;
(Continued)

(56) References Cited

U.S. PATENT DOCUMENTS 5,068,607 A * 11/1991 Redlich ..................... G01B 7/02
324/207.16
2004/0060517 A1* 4/2004 Vukovic ............... H01J 37/321
118/723 I
(Continued)

FOREIGN PATENT DOCUMENTS

JP S58-28819 A 2/1983
JP S61-169905 U 10/1986
(Continued)

OTHER PUBLICATIONS

Written Opinion of the International Searching Authority dated Apr. 24, 2018 for PCT/JP2018/006906.

*Primary Examiner* — Ishwarbhai B Patel
(74) *Attorney, Agent, or Firm* — Faegre Drinker Biddle & Reath LLP (57) ABSTRACT

A flexible printed circuit board includes: an electrically insulating substrate layer; an electrically conductive pattern stacked on at least one surface of the substrate layer; and a cover layer that is disposed on a stack including the substrate layer and the electrically conductive pattern and covers a surface of the stack, which surface is on the side on which the electrically conductive pattern is present. The electrically conductive pattern has a coil region including a coil. In the substrate layer or the cover layer, a high-magnetic permeability member is present in at least a region that overlaps the coil region in plan view.

4 Claims, 2 Drawing Sheets

(51) Int. Cl.
*H05K 1/03* (2006.01)
*H05K 1/18* (2006.01)
*H01F 17/04* (2006.01)
*H01F 17/00* (2006.01)
*H05K 1/11* (2006.01)

(52) U.S. Cl.
CPC .. *H01F 17/0006* (2013.01); *H01F 2017/0066* (2013.01); *H01F 2017/048* (2013.01); *H05K 1/0373* (2013.01); *H05K 1/0393* (2013.01); *H05K 1/11* (2013.01); *H05K 1/18* (2013.01); *H05K 2201/0154* (2013.01); *H05K 2201/0209* (2013.01); *H05K 2201/0215* (2013.01); *H05K 2201/086* (2013.01)

(58) Field of Classification Search
CPC .......... H05K 2201/086; H05K 1/0393; H05K 2201/0154; H05K 1/0373; H01F 2017/0066; H01F 2017/048; H01F 17/0006
See application file for complete search history.

(56) References Cited

U.S. PATENT DOCUMENTS

| | | | | |
|---|---|---|---|---|
| 2006/0152321 A1* | 7/2006 | Jung | ................... | H01F 17/0006 336/200 |
| 2006/0290460 A1* | 12/2006 | Waffenschmidt | ...... | H05K 1/165 336/223 |
| 2012/0262348 A1* | 10/2012 | Kubo | ................... | H01Q 1/2216 343/702 |
| 2013/0015939 A1* | 1/2013 | Inagaki | ................. | H01F 27/255 336/233 |
| 2013/0154767 A1* | 6/2013 | Kim | .................... | H01F 17/0013 333/185 |
| 2013/0249662 A1* | 9/2013 | Tonoyama | .......... | H01F 17/0013 336/200 |
| 2014/0158929 A1* | 6/2014 | Oikawa | ..................... | H01F 1/26 252/62.54 |
| 2014/0184461 A1* | 7/2014 | Kim | ..................... | H04B 5/0075 343/788 |
| 2015/0130573 A1* | 5/2015 | Araki | ................... | B22F 1/0011 335/297 |
| 2015/0145742 A1* | 5/2015 | Cao | .......................... | H01Q 1/38 343/788 |
| 2016/0086717 A1* | 3/2016 | Harada | .................... | C21D 1/00 336/233 |
| 2017/0294387 A1* | 10/2017 | Kawabata | ......... | H01L 23/49838 |

FOREIGN PATENT DOCUMENTS

| | | |
|---|---|---|
| JP | 2003-261745 A | 9/2003 |
| JP | 2006-222458 A | 8/2006 |
| JP | 2006-303405 A | 11/2006 |
| JP | 2007-503716 A | 2/2007 |
| JP | 2013-201415 A | 10/2013 |
| WO | WO-2005/020254 A2 | 3/2005 |

* cited by examiner

FLEXIBLE PRINTED CIRCUIT BOARD

TECHNICAL FIELD

The present invention relates to a flexible printed circuit board.

The present application claims priority from Japanese Patent Application No. 2017-044415 filed on Mar. 8, 2017, the entire contents of which are incorporated herein by reference.

BACKGROUND ART

Electronic devices such as personal digital assistants are being reduced in size and thickness, and this has led to a need for miniaturization and slimming of electronic components used in these devices. To address the need, flexible printed circuit boards that are flexible and enable a large number of electronic components to be mounted even in narrow spaces are widely used.

Among the electronic components mounted on the flexible printed circuit boards, coils often occupy large areas, and there is a demand for further miniaturization and slimming of the coils while their characteristic values are maintained or improved. In one technique proposed in this regard, a high-magnetic permeability layer is embedded in a printed circuit board to increase the inductance of the coil to thereby reduce the coil in size and thickness (see Japanese Unexamined Patent Application Publication No. 2006-222458).

CITATION LIST

Patent Literature

PTL 1: Japanese Unexamined Patent Application Publication No. 2006-222458

SUMMARY OF INVENTION

A flexible printed circuit board according to one aspect of the present invention includes: an electrically insulating substrate layer; an electrically conductive pattern stacked on at least one surface of the substrate layer; and a cover layer that is disposed on a stack including the substrate layer and the electrically conductive pattern and covers a surface of the stack, which surface is on a side on which the electrically conductive pattern is present, wherein the electrically conductive pattern has a coil region including a coil, and wherein, in the substrate layer or the cover layer, a high-magnetic permeability member is present in at least a region that overlaps the coil region in plan view.

DESCRIPTION OF EMBODIMENTS

Problems to be Solved by Present Disclosure

The functionality of electronic devices is increasing, and their number of components is increasing, so that the required levels of miniaturization and slimming of coils are further increasing. The printed circuit board production method and the printed circuit board described in PTL 1 do not sufficiently meet the required levels.

An object of the present disclosure is to provide a flexible printed circuit board in which the inductance of a coil is increased to thereby allow the size and thickness of the coil to be reduced.

Advantageous Effects of Present Disclosure

In the flexible printed circuit board of the present disclosure, the inductance of the coil is increased, and the size and thickness of the coil can thereby be reduced.

Description of Embodiments of Present Invention (1) A flexible printed circuit board according to one aspect of the present invention includes: an electrically insulating substrate layer; an electrically conductive pattern stacked on at least one surface of the substrate layer; and a cover layer that is disposed on a stack including the substrate layer and the electrically conductive pattern and covers a surface of the stack, which surface is on a side on which the electrically conductive pattern is present, wherein the electrically conductive pattern has a coil region including a coil, and wherein, in the substrate layer or the cover layer, a high-magnetic permeability member is present in at least a region that overlaps the coil region in plan view.

In the flexible printed circuit board, since, in the substrate layer or the cover layer, the high-magnetic permeability member is present in at least the region that overlaps the coil region including the coil in the electrically conductive pattern in plan view, the inductance of the coil in the coil region can be increased, and the coil can be reduced in size and thickness.

The "high-magnetic permeability member" means a member containing a high-magnetic permeability material. The "high-magnetic permeability material" means a magnetic material having a relative magnetic permeability of 10 or more. The "relative magnetic permeability" is the ratio of the magnetic permeability to the magnetic permeability of vacuum (the magnetic permeability/the magnetic permeability of vacuum). The high-magnetic permeability material is a material that is relatively easily magnetized by an external magnetic field. Examples of the high-magnetic permeability material include silicon steel, Supermalloy, and sendust. The magnetic permeability in embodiments of the present invention is the real part ($\mu$H/m) of the effective magnetic permeability determined from the measured value of impedance measured at a frequency of 1 MHz using a magnetic permeability measurement device.

The coil region is a region including the coil in the electrically conductive pattern and the interior of the coil. The outline of the coil coincides with the outline of the coil region in plan view and a cross-sectional view. For example, when the coil is a circular spiral coil, the coil region is a cylindrical columnar region (or a disk-shaped region) whose height is the same as the height of the coil and whose diameter is the same as the outermost diameter of the coil.

(2) Preferably, the high-magnetic permeability member is dispersed in the substrate layer or the cover layer. When the high-magnetic permeability member is dispersed in the substrate layer or the cover layer, the high-magnetic permeability member can be present close to the coil region, so that the inductance of the coil in the coil region can be further increased.

In this case, it is preferable that the high-magnetic permeability member is a filler. When the high-magnetic permeability member is a filler containing a high-magnetic permeability material (a high-magnetic permeability filler), the high-magnetic permeability member can be easily dispersed in the substrate layer or the cover layer.

(3) Preferably, the high-magnetic permeability member is stacked inside or on the substrate layer or the cover layer. When the high-magnetic permeability member is stacked inside or on the substrate layer or the cover layer, the high-magnetic permeability member can be present close to the coil region, so that the inductance of the coil in the coil region can be further increased.

In this case, it is preferable that the high-magnetic permeability member is a film. When the high-magnetic permeability member is a film containing a high-magnetic permeability material (a high-magnetic permeability film), the high-magnetic permeability member can be easily stacked inside or on the substrate layer or the cover layer. The high-magnetic permeability member may be stacked inside the substrate layer or the cover layer or on a surface thereof.

(4) Preferably, the high-magnetic permeability member is coated with an insulating coating. Even when the high-magnetic permeability member is electrically conductive, since the high-magnetic permeability member is coated with the insulating coating, the possibility that a short circuit in the coil region caused by the high-magnetic permeability member is prevented is high. When the high-magnetic permeability member is a filler or a film, the filler or the film may be coated with the insulating coating.

(5) Preferably, the insulating coating contains a coupling agent. When the insulating coating contains a coupling agent, the strength of the insulating coating increases. When the high-magnetic permeability member is a filler, the dispersibility of the filler increases.

Details of Embodiments of Present Invention

Embodiments of the flexible printed circuit board according to the present invention will be described with reference to the drawings.

First Embodiment

Flexible Printed Circuit Board

A flexible printed circuit board 1 in an embodiment of the present invention shown in FIG. 1 (hereinafter may be referred to also as a "first embodiment") includes: an electrically insulating substrate layer 2; an electrically conductive pattern stacked on at least one surface of the substrate layer 2; and a cover layer 4 that is disposed on a stack including the substrate layer 2 and the electrically conductive pattern and covers a surface of the stack, which surface is on the side on which the electrically conductive pattern is present. The electrically conductive pattern includes spiral coils, and coil regions 3 are regions including the respective spiral coils in the electrically conductive pattern. In the substrate layer 2 and the cover layer 4, a high-magnetic permeability filler 5 serving as a high-magnetic permeability member is dispersed in at least regions overlapping the coil regions 3 in plan view.

In the substrate layer 2 or the cover layer 4 of the flexible printed circuit board 1 in the first embodiment, the high-magnetic permeability filler 5 is present in at least the regions that overlap the coil regions 3 in plan view, and the inductances of the coils in the coil regions 3 are thereby increased, so that the coils can be reduced in size and thickness. To capture the magnetic flux generated in the coil regions 3 as much as possible with less leakage, it is preferable that the high-magnetic permeability filler 5 is dispersed uniformly at a high concentration in at least the coil regions 3 and the vicinities thereof within the substrate layer 2 or the cover layer 4. In the embodiment shown in FIG. 1, the high-magnetic permeability filler 5 is present in the coil regions 3 within both the substrate layer 2 and the cover layer 4. However, in some embodiments, the high-magnetic permeability filler 5 may be present in the coil regions 3 within only one of them.

Substrate Layer

The substrate layer 2 is electrically insulative and supports the electrically conductive pattern including the spiral coils, and the high-magnetic permeability filler 5 can be dispersed in the substrate layer 2.

No particular limitation is imposed on the main component of the substrate layer 2, and examples of the main component include insulating resins such as polyimides, liquid crystalline polymers, polyethylene terephthalate, polyethylene naphthalate, polyphenylene ether, and fluorocarbon resins. Of these, polyimides are preferred because their heat resistance is high and the high-magnetic permeability filler 5 can be easily dispersed therein. The "main component" is a component with the highest content among all the components and is, for example, a component with a content of 50% by mass or more.

The substrate layer 2 may be porous and may contain additives such as a plasticizer, a curing accelerator, an antistatic agent, and a flame retardant, pigments, dyes, and other fillers, so long as the desired effects of the present invention are not impaired.

No particular limitation is imposed on the average thickness of the substrate layer 2, but the lower limit of the average thickness of the substrate layer 2 is preferably 5 μm and more preferably 12 μm. The upper limit of the average thickness of the substrate layer 2 is preferably 2 mm and more preferably 1.6 mm. If the average thickness of the substrate layer 2 is less than the lower limit, the strength and insulating properties of the flexible printed circuit board 1 may be insufficient. If the average thickness of the substrate layer 2 exceeds the upper limit, the flexibility of the flexible printed circuit board 1 may be insufficient. The "average thickness" means the average of thickness values measured at 10 arbitrary points. The "average thicknesses" of other components etc. are defined similarly.

Electrically Conductive Pattern and Coil Regions

The coil regions 3 are regions including the respective spiral coils in the electrically conductive pattern stacked on at least one surface of the substrate layer 2. The inductances of the coils in the coil regions 3 are increased by the high-magnetic permeability filler 5 present in at least the regions overlapping the coil regions 3 in plan view within the substrate layer 2 and the cover layer 4.

No particular limitation is imposed on the material of the electrically conductive pattern so long as the material has good electrical conductivity. Examples of the material include metals such as copper, aluminum, and nickel. Of these, copper is preferred because it is low cost and has high electrical conductivity. The surface of the electrically conductive pattern may be subjected to plating treatment with gold, silver, tin, etc.

No particular limitation is imposed on the form of stacking the electrically conductive pattern. For example, the electrically conductive pattern may be stacked on at least one surface of the substrate layer 2 by printing using a conductive paste. Alternatively, the electrically conductive pattern may be stacked on at least one surface of the substrate layer 2 using a photoresist technology, an etching technology, etc.

No particular limitation is imposed on the average line width of the electrically conductive pattern in the coil regions 3, but the lower limit of the average line width of the electrically conductive pattern in the coil regions 3 is preferably 100 μm and more preferably 200 μm. The upper limit of the average line width of the electrically conductive pattern in the coil regions 3 is preferably 1 mm and more preferably 800 μm. When the average line width is within the above range, the coils in the coil regions 3 can be further reduced in size and thickness while the characteristic values of the coils are maintained or improved.

No particular limitation is imposed on the average thickness of the electrically conductive pattern in the coil regions 3, but the lower limit of the average thickness of the electrically conductive pattern in the coil regions 3 is preferably 2 μm and more preferably 5 μm. The upper limit of the average thickness of the electrically conductive pattern in the coil regions 3 is preferably 500 μm and more preferably 100 μm. When the average thickness is within the above range, the coils can be further reduced in size and thickness while the characteristic values of the coils in the coil regions 3 are maintained or improved.

No particular limitation is imposed on the number of turns of each of the coils in the coil regions 3, and the number of turns may be adjusted appropriately. No particular limitation is imposed on the shape of the spiral of each coil, and the spiral may be a spiral with any desired shape such as a circular spiral, an elliptical spiral, a rectangular spiral, or a spiral assembly including a plurality of combined spirals on one surface of the substrate layer 2.

Cover Layer

The cover layer 4 prevents the electrically conductive pattern from coming into contact with other members etc. to thereby prevent damage to the electrically conductive pattern and its short circuit, and the high-magnetic permeability filler 5 can be dispersed in the cover layer 4.

No particular limitation is imposed on the cover layer 4. For example, a commercial double-layer film including an insulating film and an adhesive layer may be used. When the double-layer film is used, no particular limitation is imposed on the material of the insulating film, and the same material as the material of the substrate layer 2 may be used.

No particular limitation is imposed on the average thickness of the insulating film, but the lower limit of the average thickness of the insulating film is preferably 5 μm and more preferably 10 μm. The upper limit of the average thickness of the insulating film is preferably 60 μm and more preferably 40 μm. If the average thickness of the insulating film is less than the lower limit, the insulating properties and strength of the cover layer 4 may be insufficient. If the average thickness of the insulating film exceeds the upper limit, the flexibility of the flexible printed circuit board 1 may be insufficient.

No particular limitation is imposed on the adhesive forming the adhesive layer when the double-layer film is used, but an adhesive excellent in flexibility and heat resistance is preferred. Examples of such an adhesive include various resin-based adhesives such as nylon resin-based adhesives, epoxy resin-based adhesive, butyral resin-based adhesives, and acrylic resin-based adhesives.

No particular limitation is imposed on the average thickness of the adhesive layer, but the lower limit of the average thickness of the adhesive layer is preferably 10 μm and more preferably 20 μm. The upper limit of the average thickness of the adhesive layer is preferably 50 μm and more preferably 40 μm. If the average thickness of the adhesive layer is less than the lower limit, the adhesion of the insulating film to the coil regions 3 and the substrate layer 2 may be insufficient. If the average thickness of the adhesive layer exceeds the upper limit, the flexibility of the flexible printed circuit board 1 may be insufficient.

The cover layer 4 used may be a solder resist such as a photosensitive solder resist, a thermosetting solder resist, or a dry film-type solder resist.

No particular limitation is imposed on the main component of the solder resist, and examples of the main component include epoxy resins, polyimides, and silicone resins. Of these, epoxy resins are preferred, and epoxy acrylate resins are particularly preferably used.

No particular limitation is imposed on the average thickness of the cover layer 4 formed from the solder resist, but the lower limit of the average thickness is preferably 5 μm and more preferably 10 μm. The upper limit of the average thickness is preferably 50 μm and more preferably 30 μm. If the average thickness is less than the lower limit, the insulating properties and strength of the cover layer 4 may be insufficient. If the average thickness exceeds the upper limit, the flexibility of the flexible printed circuit board 1 may be insufficient.

High-Magnetic Permeability Filler

The high-magnetic permeability filler 5 is dispersed in at least the regions overlapping the coil regions 3 in plan view within the substrate layer 2 and the cover layer 4 and is a member that increases the inductances of the coils in the coil regions 3.

No particular limitation is imposed on the material of the high-magnetic permeability filler 5, and examples of the material include: metals such as iron, cobalt, and nickel; alloys such as Fe—Co alloys, Fe—Pt alloys, Permalloys (Fe—Ni alloys), Supermalloys (Fe—Ni—Mo alloys), Fe—Ni—Co alloys, Fe—Si alloys, Fe—Si—Cr alloys, sendusts (Fe—Si—Al alloys), Fe—Cu—Si alloys, magnetic stainless steel (such as Fe—Cr—Al—Si alloys), Fe—Si—B (—Cu—Nb) alloys, Fe—Si—Cr—Ni alloys, and Fe—Si—Al—Ni—Cr alloys; and ferrites such as $MnFe_2O_4$, $FeFe_2O_4$, $CoFe_2O_4$, $NiFe_2O_4$, $BaFe_2O_4$, $SrFe_2O_4$, and $CuFe_2O_4$. Of these, sendusts are preferred because of their magnetic properties. The high-magnetic permeability filler 5 may be a mixture of any of the above materials and a non-magnetic material.

The lower limit of the relative magnetic permeability of the high-magnetic permeability filler 5 is preferably 10, more preferably 15, and still more preferably 20. When the relative magnetic permeability of the high-magnetic permeability filler 5 is equal to or more than the lower limit, the inductances of the coils in the coil regions 3 can be further increased.

No particular limitation is imposed on the shape of the high-magnetic permeability filler 5, and the high-magnetic permeability filler 5 may have, for example, a spherical shape, a spheroidal shape, a scaly shape, a needle shape, or a columnar shape. Of these, spherical and spheroidal shapes are preferred because friction between filler particles is small and dispersibility is high, and a spherical shape is more preferred.

No particular limitation is imposed on the average particle diameter of the high-magnetic permeability filler 5, but the lower limit of the average particle diameter of the high-magnetic permeability filler 5 is preferably 0.1 µm, more preferably 0.3 µm, and still more preferably 0.5 µm. The upper limit of the average particle diameter of the high-magnetic permeability filler 5 is preferably 100 µm, more preferably 70 µm, and still more preferably 50 µm. If the average particle diameter of the high-magnetic permeability filler 5 is less than the lower limit, the magnetic characteristics and dispersibility of the high-magnetic permeability filler 5 tend to deteriorate. If the average particle diameter of the high-magnetic permeability filler 5 exceeds the upper limit, the strength of the substrate layer 2 or the cover layer 4 in which the high-magnetic permeability filler 5 is dispersed may be reduced. The "average particle diameter" is a median diameter (D50) computed from a cumulative distribution measured by a laser diffraction method.

No particular limitation is imposed on the average aspect ratio of the high-magnetic permeability filler 5, but the upper limit of the average aspect ratio of the high-magnetic permeability filler 5 is preferably 5.0, more preferably 3.0, and still more preferably 2.0. If the average aspect ratio of the high-magnetic permeability filler 5 exceeds the upper limit, the dispersibility of the high-magnetic permeability filler 5 tends to deteriorate. The average aspect ratio means the ratio of the average major axis to the average minor axis.

No particular limitation is imposed on the content of the high-magnetic permeability filler 5 based on the total mass of the substrate layer 2 and the cover layer 4, but the lower limit of the content is preferably 30% by mass, more preferably 35% by mass, and still more preferably 40% by mass. The upper limit of the content is preferably 85% by mass, more preferably 80% by mass, and still more preferably 75% by mass. When the content is within the above range, the inductances of the coils in the coil regions 3 can be further increased while the strength and flexibility of the flexible printed circuit board 1 are maintained.

When the high-magnetic permeability filler 5 is electrically conductive, it is preferable that the surface of the high-magnetic permeability filler 5 is covered with an insulating coating so that the occurrence of a short circuit is prevented even when the high-magnetic permeability filler 5 enters spaces between traces of the electrically conductive pattern in the coil regions 3. It is preferable that the insulating coating can provide insulation even when its thickness is small so that the improvement in the inductance by the high-magnetic permeability filler 5 is not hindered. Examples of the material forming such an insulating coating include metal oxides. Examples of the metal oxides include aluminum oxide, magnesium oxide, titanium dioxide, zirconium oxide, and tantalum oxide. Of these, aluminum oxide excellent in insulating properties is preferred. When the high-magnetic permeability filler 5 is a metal-based filler, the insulating coating can be formed by subjecting the surface of the high-magnetic permeability filler 5 to oxidation treatment such as anodic oxidation, plasma treatment, or flame treatment.

The insulating coating may be formed from an insulating resin such as a fluorocarbon resin, an acrylic resin, an epoxy resin, a polyamide, a polyamide-imide, a polyester, a urea resin, a melamine resin, a phenolic resin, or a silicone resin. The amount of the insulating resin used is generally 0.5 parts by mass or more and 5.0 parts by mass or less based on 100 parts by mass of the high-magnetic permeability filler 5.

When the insulating coating is formed from the insulating resin, it is preferable to treat the surface of the high-magnetic permeability filler 5 with a coupling agent before the surface is coated with the insulating resin. By treating the surface with the coupling agent, the adhesion between the high-magnetic permeability filler 5 and the insulating coating increases, and the dispersibility of the high-magnetic permeability filler 5 and the strength of the insulating coating may thereby be increased. Examples of the coupling agent include silane coupling agents such as vinyltrimethoxysilane, vinyltriethoxysilane, 3-methacryloxypropyltrimethoxysilane, 3-glycidoxypropyltrimethoxysilane, and 3-glycidoxypropylmethyldiethoxysilane. The amount of the coupling agent used is generally 0.5 parts by mass or more and 2.0 parts by mass or less based on 100 parts by mass of the high-magnetic permeability filler 5.

Method for Producing Flexible Printed Circuit Board

The flexible printed circuit board 1 in the first embodiment can be produced by a production method including: the step of stacking the electrically conductive pattern on at least one surface of the substrate layer 2 (this step is hereinafter referred to also as an "electrically conductive pattern stacking step"); the step of forming the cover layer 4 by covering, with the insulating resin, a surface of the stack including the substrate layer 2 and the electrically conductive pattern, which surface is on the side on which the electrically conductive pattern is present (this step is hereinafter referred to also as a "cover layer forming step"); and the step of dispersing the high-magnetic permeability filler 5 in at least regions overlapping the coil regions 3 in plan view within the substrate layer 2 and the cover layer 4 (this step is hereinafter referred to also as a "high-magnetic permeability filler dispersing step").

Electrically Conductive Pattern Stacking Step

In the electrically conductive pattern stacking step, the electrically conductive pattern including the spiral coils is stacked on at least one surface of the substrate layer 2. To obtain the form shown in FIG. 1 in which the high-magnetic permeability filler 5 is dispersed in the substrate layer 2, it is necessary that the substrate layer 2 used contain the high-magnetic permeability filler 5 pre-dispersed therein. This will be described in the high-magnetic permeability filler dispersing step.

Examples of the electrically conductive pattern stacking step include: the step of stacking the electrically conductive pattern on at least one surface of the substrate layer 2 containing the high-magnetic permeability filler 5 pre-dispersed therein by printing using a conductive paste; and the step of stacking the electrically conductive pattern by forming a metal film on at least one surface of the substrate layer 2 containing the high-magnetic permeability filler 5 pre-dispersed therein by electroplating, application of metal foil, evaporation of the metal, or sputtering, then masking the metal film, and etching the resulting metal film.

Cover Layer Forming Step

In the cover layer forming step, the cover layer 4 is formed by covering, with the insulating resin, the surface of the stack including the substrate layer 2 and the electrically conductive pattern, which surface is on the side on which the electrically conductive pattern is present. The insulating resin may be the above-described double-layer film, the above-described solder resist, etc. To obtain the form shown in FIG. 1 in which the high-magnetic permeability filler 5 is dispersed in the cover layer 4, it is necessary to pre-disperse the high-magnetic permeability filler 5 in the double-layer film, the solder resist, etc. This will be described in the high-magnetic permeability filler dispersing step. In the cover layer forming step, it is only necessary to cover the stack with the double-layer film, solder resist, etc. containing the high-magnetic permeability filler 5 pre-dispersed therein.

High-Magnetic Permeability Filler Dispersing Step

Figure 1:
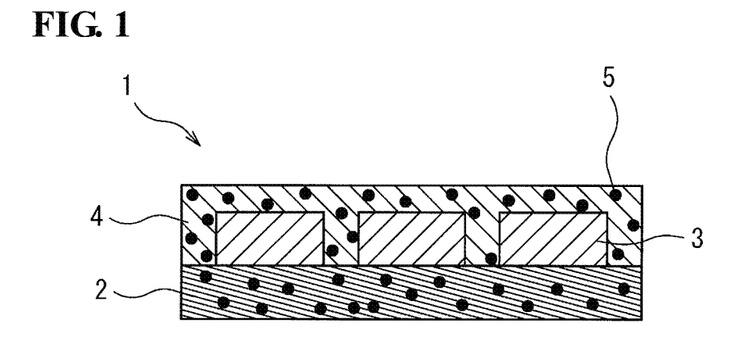
FIG. 1 is a schematic cross-sectional view of a flexible printed circuit board in an embodiment of the present invention.

The step of dispersing the high-magnetic permeability filler 5 in at least the regions overlapping the coil regions 3 in plan view within the substrate layer 2 and the cover layer 4 as shown in FIG. 1 is performed, for example, using a method in which the high-magnetic permeability filler 5 is dispersed in a molten matrix resin for the substrate layer 2 when the substrate layer 2 is produced, a method in which the high-magnetic permeability filler 5 is dispersed in the insulating film or the adhesive layer when the double-layer film is produced, or a method in which the high-magnetic permeability filler 5 is dispersed in the solder resist when the solder resist is prepared. It is preferable that the high-magnetic permeability filler 5 with the above-described insulating coating pre-formed thereon is used for dispersion. When the insulating coating is formed from the insulating resin, it is preferable to perform the surface treatment with the above-described coupling agent.

Second Embodiment

Flexible Printed Circuit Board

Figure 2:
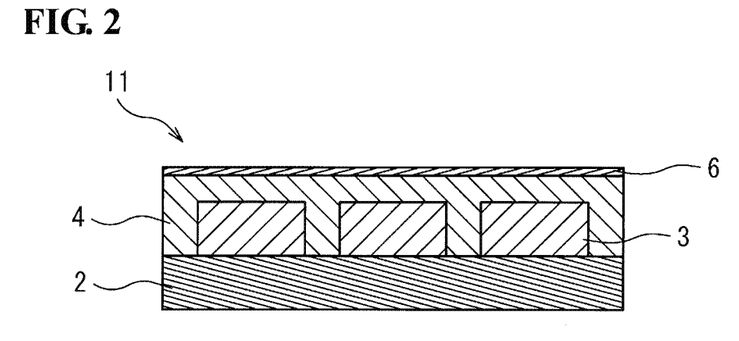
FIG. 2 is a schematic cross-sectional view of a flexible printed circuit board in an embodiment that differs from the flexible printed circuit board in FIG. 1 in the present invention.

A flexible printed circuit board 11 in an embodiment of the present invention shown in FIG. 2 (this embodiment is hereinafter referred to also as a "second embodiment") includes: an electrically insulating substrate layer 2; an electrically conductive pattern stacked on at least one surface of the substrate layer 2; and a cover layer 4 that is disposed on a stack including the substrate layer 2 and the electrically conductive pattern and covers a surface of the stack, which surface is on the side on which the electrically conductive pattern is present. The electrically conductive pattern includes spiral coils, and coil regions 3 are regions including the respective spiral coils in the electrically conductive pattern. A high-magnetic permeability film 6 serving as a high-magnetic permeability member is stacked on the upper side of the coil regions 3 in the cover layer 4 so as to be located in at least a region overlapping the coil regions 3 in plan view.

In the flexible printed circuit board 11 in the second embodiment, the high-magnetic permeability film 6 is stacked in the vicinities of the coil regions 3. The inductances of the coils in the coil regions 3 are thereby increased, so that the coils can be reduced in size and thickness. To capture the magnetic flux generated in the coil regions 3 as much as possible, it is preferable that the high-magnetic permeability film 6 is stacked so as to overlap the entire coil regions 3 in plan view.

The substrate layer 2, the electrically conductive pattern, the coil regions 3, and the cover layer 4 in the second embodiment may be the same as those in the first embodiment, except for the high-magnetic permeability filler 5.

High-Magnetic Permeability Film

No particular limitation is imposed on the high-magnetic permeability film 6, and the high-magnetic permeability film 6 may be, for example, a film prepared by dispersing a high-magnetic permeability filler in a molten matrix resin, filling a mold with the resulting resin, and then heat-curing the resin. Examples of the high-magnetic permeability filler used include those exemplified for the high-magnetic permeability filler 5 in the first embodiment.

No particular limitation is imposed on the matrix resin, but it is preferable that the matrix resin is a thermosetting resin that, when in a molten state, allows the high-magnetic permeability filler to be dispersed therein uniformly. Examples of such a resin include epoxy resins, urethane resins, melamine resins, urea reins, and phenolic resins. Of these, epoxy resins excellent in dispersibility are preferred. A combination of several types of these resins may be used. A thermoplastic resin such as polyethylene or polyester may be used in combination with these resins so long as the desired effects of the invention are not impaired. Additives such as a plasticizer and an accelerator, a pigment, a dye, and other components may also be used.

No particular limitation is imposed on the mass ratio of the high-magnetic permeability filler to the matrix resin, but the lower limit of the mass ratio of the high-magnetic permeability filler to the matrix resin is preferably 30/70 and more preferably 35/65. The upper limit of the mass ratio of the high-magnetic permeability filler to the matrix resin is preferably 85/15 and more preferably 80/20. When the mass ratio is within the above range, the high-magnetic permeability film 6 obtained is excellent in magnetic characteristics and handleability.

The lower limit of the relative magnetic permeability of the high-magnetic permeability film 6 is preferably 10, more preferably 15, and still more preferably 20. When the relative magnetic permeability of the high-magnetic permeability film 6 is equal to or more than the lower limit, the inductances of the coils in the coil regions 3 can be further increased. The lower limit of the surface resistivity of the high-magnetic permeability film 6 is preferably $1.0 \times 10^6$ Ω/sq., more preferably $1.0 \times 10^7$ Ω/sq., and still more preferably $1.0 \times 10^8$ Ω/sq. When the surface resistivity of the high-magnetic permeability film 6 is equal to or more than the lower limit, eddy-current loss in a high-frequency range is further reduced.

No particular limitation is imposed on the average thickness of the high-magnetic permeability film 6 when it is stacked on the upper surface of the cover layer 4, but the lower limit of the average thickness is preferably 50 μm and more preferably 100 μm. The upper limit of the average thickness is preferably 500 μm and more preferably 300 μm. When the average thickness is within the above range, the inductances of the coils in the coil regions 3 can be further increased while the strength and flexibility of the flexible printed circuit board 11 are maintained.

Method for Producing Flexible Printed Circuit Board

The flexible printed circuit board 11 in the second embodiment can be produced by a production method including an electrically conductive pattern stacking step, a cover layer forming step, and the step of stacking the high-magnetic permeability film 6 on a surface of the cover layer 4 that is opposite to the substrate layer 2 (this step is hereinafter referred to also as a "cover layer surface stacking step"). The electrically conductive pattern stacking step and the cover layer forming step may be performed in the same manner as in the first embodiment except for the high-magnetic permeability filler 5.

Cover Layer Surface Stacking Step

In the cover layer surface stacking step, the high-magnetic permeability film 6 is stacked on the surface of the cover layer 4 formed in the cover layer forming step, which surface is opposite to the substrate layer 2. Examples of the method for stacking include: a method in which the high-magnetic permeability film 6 produced in advance is stacked on the upper surface of the cover layer 4; and a method in which a solder resist containing the high-magnetic permeability filler dispersed therein is stacked on the upper surface of the cover layer 4 and then cured by heating, exposure to light, etc.

Third Embodiment

Flexible Printed Circuit Board

Figure 3:
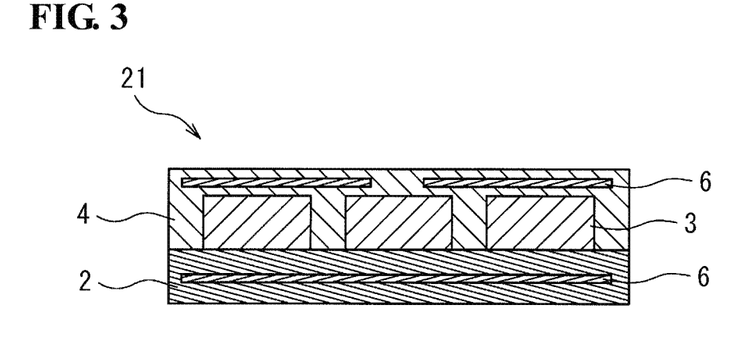
FIG. 3 is a schematic cross-sectional view of a flexible printed circuit board in an embodiment that differs from the flexible printed circuit boards in FIGS. 1 and 2 in the present invention.

A flexible printed circuit board 21 in an embodiment of the present invention shown in FIG. 3 (this embodiment is hereinafter referred to also as a "third embodiment") includes: an electrically insulating substrate layer 2; an electrically conductive pattern stacked on at least one surface of the substrate layer 2; and a cover layer 4 that is disposed on a stack including the substrate layer 2 and the electrically conductive pattern and covers a surface of the stack, which surface is on the side on which the electrically conductive pattern is present. The electrically conductive pattern includes spiral coils, and coil regions 3 are regions including the respective spiral coils in the electrically conductive pattern. High-magnetic permeability films 6 each serving as a high-magnetic permeability member are stacked inside the substrate layer 2 and the cover layer 4 and located in at least regions overlapping the coil regions 3 in plan view. When the high-magnetic permeability films 6 are electrically conductive, it is preferable to form an insulating coating on the surface of each high-magnetic permeability film 6 in order to prevent a short circuit in the coil regions 3. Examples of the method for forming the insulating coating include a method in which an insulating resin is stacked on both sides of the high-magnetic permeability films 6.

In the flexible printed circuit board 21 in the third embodiment, the high-magnetic permeability films 6 are stacked in the vicinities of the coil regions 3. Therefore, the inductances of the coils in the coil regions 3 can be increased, and the coils can be reduced in size and thickness. To capture the magnetic flux generated in the coil regions 3 as much as possible, it is preferable that the high-magnetic permeability films 6 are stacked so as to cover the entire coil regions 3 in plan view.

The coil regions 3, the electrically conductive pattern, and the high-magnetic permeability films 6 in the third embodiment may be the same as those in the second embodiment except for the average thickness of the high-magnetic permeability films 6 and the step of stacking the high-magnetic permeability films 6. The substrate layer 2 and the cover layer 4 may also be the same as those in the second embodiment except for the step of stacking the high-magnetic permeability films 6. The step of stacking the high-magnetic permeability films 6 in the third embodiment will be described in a method for producing the flexible printed circuit board 21.

The lower limit of the average thickness of each of the high-magnetic permeability films 6 stacked inside the substrate layer 2 and the cover layer 4 depends on the average thicknesses of the substrate layer 2, the cover layer 4, and the electrically conductive pattern and is preferably 2.5 μm and more preferably 6 μm. The upper limit of the average thickness of each high-magnetic permeability film 6 is preferably 30 μm and more preferably 20 μm. When the average thickness is within the above range, the inductances of the coils in the coil regions 3 can be further increased while the strength and flexibility of the flexible printed circuit board 21 are maintained.

Method for Producing Flexible Printed Circuit Board

The flexible printed circuit board 21 in the third embodiment can be produced by a production method including: an electrically conductive pattern stacking step; a cover layer forming step; and the step of stacking the high-magnetic permeability films 6 inside the substrate layer 2 and the cover layer 4 so as to be located in at least regions overlapping the coil regions 3 in plan view (this step is referred to also as a "substrate layer etc. internally stacking step"). The electrically conductive pattern stacking step can be performed in the same manner as in the first embodiment. However, it is necessary that the substrate layer 2 used include a high-magnetic permeability film 6 pre-stacked thereinside.

Substrate Layer etc. Internally Stacking Step

No particular limitation is imposed on the step of stacking a high-magnetic permeability film 6 inside the substrate layer 2. One example of this step includes preparing a substrate layer 2 having a three-layer structure including two outer layers serving as base films and an intermediate layer serving as the high-magnetic permeability film 6. In the step of preparing the three-layer structure, the high-magnetic permeability film 6 produced in advanced may be sandwiched between the base films. Alternatively, a heated molten raw material of the high-magnetic permeability film 6 may be applied to a base film and heat-cured to form the high-magnetic permeability film 6, and another base film may be stacked on the upper surface of the high-magnetic permeability film 6.

No particular limitation is imposed on the step of stacking a high-magnetic permeability film 6 inside the cover layer 4. One example of this step includes: preparing a double-layer film including the high-magnetic permeability film 6 pre-stacked inside an insulating film or an adhesive layer or at their boundary surface; and covering, with the double-layer film, a surface of a stack including the substrate layer 2 and the electrically conductive pattern, which surface is on the side on which the electrically conductive pattern is present.

Fourth Embodiment

Flexible Printed Circuit Board

A flexible printed circuit board 31 in an embodiment of the present invention shown in FIG. 4 (this embodiment is hereinafter referred to also as a "fourth embodiment") includes: an electrically insulating substrate layer 2; an electrically conductive pattern stacked on at least one surface of the substrate layer 2; and a cover layer 4 that is disposed on a stack including the substrate layer 2 and the electrically conductive pattern and covers a surface of the stack, which surface is on the side on which the electrically conductive pattern is present. The electrically conductive pattern includes spiral coil regions 3. A high-magnetic permeability filler 5 serving as a high-magnetic permeability member is dispersed in at least a region overlapping the coil regions 3 in plan view within the cover layer 4, and a high-magnetic permeability film 6 serving as a high-magnetic permeability member is stacked inside the substrate layer 2 so as to be located in at least a region overlapping the coil regions 3 in plan view.

Figure 4:
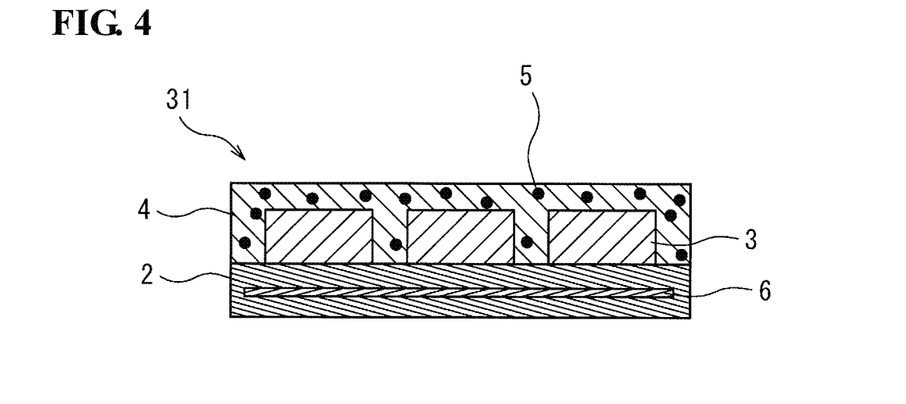
FIG. 4 is a schematic cross-sectional view of a flexible printed circuit board in an embodiment that differs from the flexible printed circuit boards in FIGS. 1, 2, and 3 in the present invention.

In the flexible printed circuit board 31 in the fourth embodiment, since the high-magnetic permeability filler 5 and the high-magnetic permeability film 6 are present in the vicinities of the coil regions 3 as shown in FIG. 4, the inductances of the coils in the coil regions 3 can be increased, and the coils can be reduced in size and thickness. To capture the magnetic flux generated in the coil regions 3 as much as possible, it is preferable that the high-magnetic permeability film 6 is stacked so as to overlap the entire coil regions 3 in plan view.

The coil regions 3, the electrically conductive pattern, the cover layer 4, and the high-magnetic permeability filler 5 in the fourth embodiment may be the same as those in the first embodiment. The substrate layer 2 and the high-magnetic permeability film 6 in the fourth embodiment may be the same as those in the third embodiment.

Method for Producing Flexible Printed Circuit Board

The flexible printed circuit board 31 in the fourth embodiment can be produced by a production method including: an electrically conductive pattern stacking step; a cover layer forming step; a high-magnetic permeability filler dispersing step, and a substrate layer etc. internally stacking step. The electrically conductive pattern stacking step, the cover layer forming step, and the high-magnetic permeability filler dispersing step may be performed in the same manner as in the first embodiment, and the substrate layer etc. internally stacking step can be performed in the same manner as in the third embodiment.

Advantages

In the flexible printed circuit board, since the high-magnetic permeability members are present in the vicinities of the coil regions 3, the inductances of the coils in the coil regions 3 can be increased, and therefore the coils can be reduced in size and thickness. In particular, the flexible printed circuit board is preferably applicable to a flexible printed circuit board including a coil with no magnetic component.

In the flexible printed circuit board, since the high-magnetic permeability members are present in the vicinities of the coil regions 3, the amount of magnetic flux leakage is small. Therefore, even when a metal is present in the vicinity of the flexible printed circuit board, the amount of eddy current generated in the metal can be reduced, and a reduction in the inductances of the coils in the coil regions 3 due to the eddy current can thereby be reduced.

In the flexible printed circuit board, the relative magnetic permeability, content, existence form, etc. of each high-magnetic permeability member can be easily changed, so that the characteristic values of the coils in the coil regions 3 can be easily controlled.

In the first, third, and fourth embodiments, the high-magnetic permeability members are present in at least regions overlapping the coil regions including the coils in plan view within the substrate layer and the cover layer. In this case, since the high-magnetic permeability members are present on both sides of the coils (the upper and lower sided of the coils in FIGS. 1, 3, and 4), the inductances of the coils can be further efficiently increased.

Other Embodiments

It should be noted that the embodiments described above are illustrative and non-restrictive in every respect. The scope of the present invention is not limited to the structures of the embodiments but is defined by the scope of the claims and is intended to include any modifications within the scope and meaning equivalent to the scope of the claims.

It is unnecessary that the width and length of each high-magnetic permeability film 6 be the same as those of the substrate layer 2 and the cover layer 4. Like the high-magnetic permeability films 6 stacked inside the cover layer 4 in FIG. 3, divided films having an appropriate size may be stacked. When divided high-magnetic permeability films 6 are used, no particular limitation is imposed on their shape, and the films may have any shape such as a triangular shape, a rectangular shape, a circular shape, an elliptic shape, or an indefinite shape.

A high-magnetic permeability member present in a different form may be used. Although not illustrated, a high-magnetic permeability film 6 may be stacked on a surface of the substrate layer 2 that is opposite to the cover layer 4. Some of the various embodiments described above may be combined.

The form of the high-magnetic permeability member is not limited to the high-magnetic permeability filler 5 and the high-magnetic permeability films 6. For example, a high-magnetic permeability rod-shaped, filament-shaped, or spiral-shaped body may be present inside the substrate layer 2 or the cover layer 4.

In the first to fourth embodiments, the electrically conductive pattern is stacked on only one side of the substrate layer 2. In some embodiments, electrically conductive patterns may be stacked on both sides. In an embodiment in which electrically conductive patterns are stacked on both sides, the high-magnetic permeability member may be present only on one side or on both sides.

In the first to fourth embodiments, electronic components other than the coils are not shown explicitly. However, the flexible printed circuit board may include other electronic components such as a resistor and a capacitor.

In the first to fourth embodiments, layers other than the substrate layer 2, the electrically conductive pattern, and the cover layer 4 including the insulating film and the adhesive layer are not shown explicitly. However, the flexible printed circuit board may include other layers such as a primer layer.

Each high-magnetic permeability member may be prepared by dispersing or stacking a non-magnetized member inside the substrate layer 2 or the cover layer 4 or stacking the non-magnetized member on a surface of the substrate layer 2 or the cover layer 4 and then magnetizing the non-magnetized member by well-known magnetization means to increase magnetic permeability.

In the first to fourth embodiments, each coil is a spiral coil but may be a single-turn coil.

In the first embodiment, the high-magnetic permeability member (the high-magnetic permeability filler 5) is dispersed inside the substrate layer 2 and the cover layer 4. In the fourth embodiment, the high-magnetic permeability member (the high-magnetic permeability filler 5) is dispersed inside the cover layer 4. However, the high-magnetic permeability member (the high-magnetic permeability filler 5) may be dispersed on at least one surface of the substrate layer 2 and the cover layer 4. Specifically, it is only necessary that the high-magnetic permeability member be present in at least a region overlapping the coil regions 2 in plan view within or on the surface of the substrate layer 2 or the cover layer 4.

In the fourth embodiment, the high-magnetic permeability filler 5 serving as a high-magnetic permeability member is dispersed in at least a region overlapping the coil regions 3 in plan view within the cover layer 4, and the high-magnetic permeability film 6 serving as a high-magnetic permeability member is stacked in at least a region overlapping the coil regions 3 in plan view within the substrate layer 2. However, the high-magnetic permeability filler 5 serving as a high-magnetic permeability member may be dispersed in at least a region overlapping the coil regions 3 in plan view within the substrate layer 2, and a high-magnetic permeability film 6 serving as a high-magnetic permeability member may be stacked in at least a region overlapping the coil regions 3 in plan view within the cover layer 4.

The high-magnetic permeability filler 5 may be dispersed in at least a region overlapping the coil regions 3 in plan view within the substrate layer 2, and a high-magnetic permeability film 6 may be stacked in this region. Specifically, both the high-magnetic permeability filler 5 and the high-magnetic permeability film 6 may be present in at least the region overlapping the coil regions 3 in plan view within the substrate layer 2.

Similarly, the high-magnetic permeability filler 5 may be dispersed in at least a region overlapping the coil regions 3 in plan view within the cover layer 4, and a high-magnetic permeability film 6 may be stacked in this region. Specifically, both the high-magnetic permeability filler 5 and the high-magnetic permeability film 6 may be present in at least the region overlapping the coil regions 3 in plan view within the cover layer 4.

REFERENCE SIGNS LIST 1, 11, 21, 31 flexible printed circuit board
2 substrate layer
3 coil region
4 cover layer
5 high-magnetic permeability filler
6 high-magnetic permeability film

The invention claimed is:

1. A flexible printed circuit board comprising:
an electrically insulating substrate layer;
an electrically conductive pattern stacked on at least one surface of the substrate layer; and
a cover layer that is disposed on a stack including the substrate layer and the electrically conductive pattern and covers a surface of the stack, which surface is on a side on which the electrically conductive pattern is present,
wherein the electrically conductive pattern has a coil region including a coil,
wherein, in the substrate layer or the cover layer, a high-magnetic permeability member is present in at least a region that overlaps the coil region in plan view,
wherein the high-magnetic permeability member is a filler,
wherein an upper limit of the average aspect ratio of the high-magnetic permeability filler is 5.0,
wherein the high-magnetic permeability filler is dispersed in the substrate layer and the cover layer,
wherein an average thickness of the substrate layer is 5 μm or more and 2 mm or less,
wherein the cover layer is a double-layer film including an insulating film and an adhesive layer, an average thickness of the insulating film is 5 μm or more and 60 μm or less, and an average thickness of the adhesive layer is 10 μm or more and 50 μm or less,
wherein a relative magnetic permeability of the high-magnetic permeability filler is 10 or more, and
wherein a content of the high-magnetic permeability filler, based on a total mass of the substrate layer and the cover layer, is 30% by mass or more and 85% by mass or less.

2. The flexible printed circuit board according to claim 1, wherein the high-magnetic permeability member is stacked inside or on the substrate layer or the cover layer.

3. The flexible printed circuit board according to claim 1, wherein the high-magnetic permeability member is covered with an insulating coating.

4. The flexible printed circuit board according to claim 3, wherein the insulating coating contains a coupling agent.

* * * * *